(12) United States Patent
Ehls et al.

(10) Patent No.: US 12,555,715 B2
(45) Date of Patent: Feb. 17, 2026

(54) INDUCTIVE PROXIMITY SWITCH AND METHOD FOR SENSING OBJECTS

(71) Applicant: TURCK Holding GmbH, Halver (DE)

(72) Inventors: Stefan Ehls, Hagen (DE); Jens Müller, Schwarzenberg (DE)

(73) Assignee: TURCK Holding GmbH, Halver (DE)

( * ) Notice: Subject to any disclaimer, the term of this patent is extended or adjusted under 35 U.S.C. 154(b) by 807 days.

(21) Appl. No.: 17/821,300

(22) Filed: Aug. 22, 2022

(65) Prior Publication Data

US 2023/0068496 A1    Mar. 2, 2023

(30) Foreign Application Priority Data

Aug. 24, 2021 (DE) ............... 102021121886.1

(51) Int. Cl.
*H01F 27/28* (2006.01)
*H03K 17/95* (2006.01)

(52) U.S. Cl.
CPC .... *H01F 27/2804* (2013.01); *H01F 2027/2809* (2013.01); *H03K 17/9505* (2013.01); *H03K 17/9545* (2013.01)

(58) Field of Classification Search
CPC ........ H01F 27/2804; H01F 2027/2809; H03K 17/9505; H03K 17/9545
USPC ................................. 324/207.15
See application file for complete search history.

(56) References Cited

U.S. PATENT DOCUMENTS

2012/0206132 A1*  8/2012  Lepage ............. G01N 27/9006
                                                                 324/239
2013/0119978 A1*  5/2013  Freise .................. G01D 3/028
                                                                 324/207.16

FOREIGN PATENT DOCUMENTS

| DE | 4102542 A1 | 7/1992 | |
|---|---|---|---|
| DE | 19850749 C1 * | 3/2000 | ............. G01V 3/107 |
| DE | 4429314 B4 | 2/2005 | |
| DE | 102006053023 A1 | 8/2007 | |
| WO | 2006/084675 A1 | 8/2006 | |

OTHER PUBLICATIONS

European Search Report in EP Appl. No. 22186670.0 mailed Dec. 9, 2022, 7 pages.

* cited by examiner

*Primary Examiner* — Stephanie E Bloss
*Assistant Examiner* — Michael A Harrison
(74) *Attorney, Agent, or Firm* — Kowert, Hood, Munyon, Rankin & Goetzel, P.C; Gentry C. McLean; Dean M. Munyon

(57) ABSTRACT

Techniques are disclosed relating to sensing an object using an inductive proximity sensor. In an embodiment, an apparatus includes a transmission coil having turns formed on a first circuit board and including a first primary winding having a first winding direction. The apparatus further includes a first sensor coil having turns formed on a second circuit board and including a second primary winding having a second winding direction and a second sensor coil having turns formed on a third circuit board and including a third primary winding having a third winding direction opposite to the second winding direction. The coils are spaced apart from one another in a common axial direction and at least one of the coils includes a compensation winding having at least one turn, where the compensation winding is arranged radially outside of, and has a winding direction opposite to, the same coil's primary winding.

20 Claims, 5 Drawing Sheets

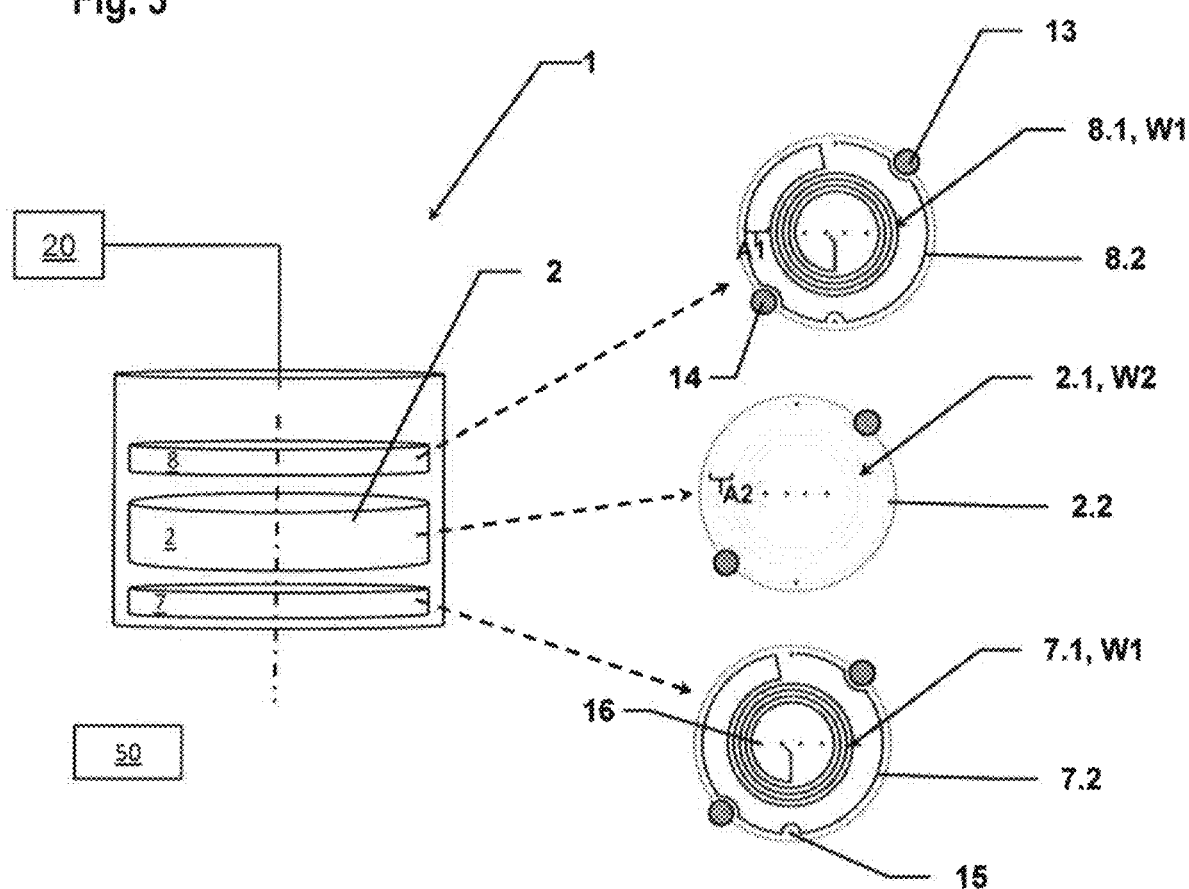

INDUCTIVE PROXIMITY SWITCH AND METHOD FOR SENSING OBJECTS

PRIORITY CLAIM

The present application claims priority under 35 U.S.C. § 119 to German patent application 10 2021 121 886.1, filed Aug. 24, 2021, the disclosure of which is incorporated by reference herein in its entirety.

BACKGROUND

Technical Field

This disclosure relates generally to electronic circuits, and more particularly to inductive proximity sensors or switches.

Description of the Related Art

Inductive proximity switches generate an alternating magnetic field using a transmission coil, and use one or more sensor coils to sense a change in the oscillation state of the magnetic field caused by a penetrating object. Prior designs may exhibit disadvantages such as limited switching distance.

BRIEF DESCRIPTION OF THE DRAWINGS

FIG. 3 is a perspective view of an embodiment of a proximity sensor.

DETAILED DESCRIPTION

Figure 1:
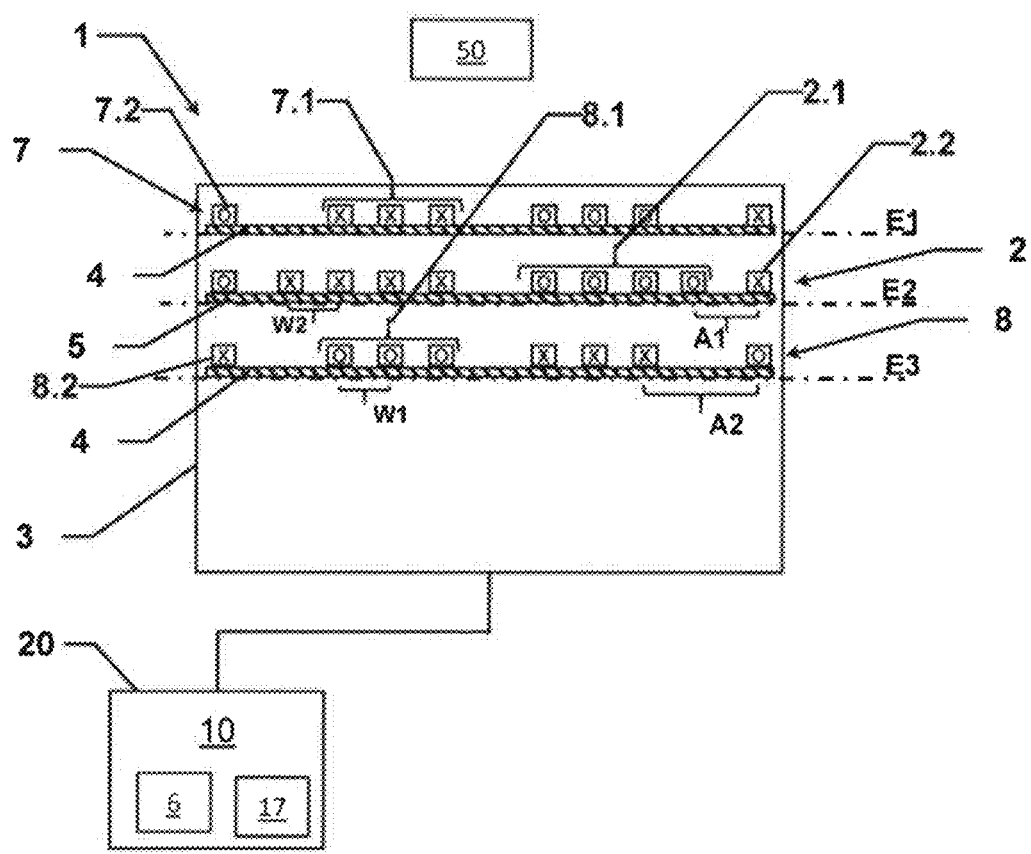
FIG. 1 is a cross-sectional view of an embodiment of a proximity sensor with a block diagram depicting associated circuitry.

Inductive proximity switches have been used for sensing metallic elements. For example, DE 44 29 314 B4 describes such a proximity switch, in which an alternating magnetic field is generated in a coil, with the result that a penetrating metallic object influences the oscillation state. The sensed change in the oscillation state is evaluated with a circuit, wherein, in the alternating field, two sensor coils are arranged in a direct differential circuit for sensing the induced voltages. The differential voltage of the sensor coils becomes zero at the operating distance. In the solution according to DE 44 29 314 B4, the wound coils are arranged in three planes or at three levels. A disadvantage of this solution is that the wound coils have a tendency to age, with the result that the switching distance drifts over time. In particular, with wound coils, the maximum achievable switching distance is very limited.

Therefore, an improved inductive proximity switch with a planar transmitting coil arrangement generating an alternating magnetic field and having a transmitting coil and a compensating coil surrounding it coaxially is already proposed in DE 10 2006 053 023 A1. Furthermore, a receiving coil is provided, wherein the transmitting coil and the common compensating coil are energized with alternating currents with opposing phases, and the transmitting coil is connected in the opposite direction to the compensating coil and has a larger number of turns. Due to the common compensating coil and the external field generated by it and the field lines thereof, the field lines of the transmitting coil are compensated in the surrounding area, with the result that as a whole the flux in the surrounding area can be brought to zero or substantially zero. According to DE 10 2006 053 023 A1, the receiving coil is arranged between transmitting coil and compensating-transmitting coil, and a planar arrangement in which transmitting, receiving and compensating turns are ideally located on one plane is proposed as ideal solution. However, only standard switching distances are achieved by the system in this way; extended switching distances cannot be realized.

An object of the disclosed embodiments is to propose an improved coil arrangement, in which extended switching distances can be realized. In various disclosed embodiments, this is achieved by an inductive proximity sensor or switch and a method for sensing an object. The respective associated claims set out advantageous designs.

Accordingly, the object is achieved by an inductive proximity switch with a generator and/or oscillator, which energizes a transmitting coil generating an alternating magnetic field, and the oscillation state of which can be influenced by a metallic object penetrating into the alternating field, and with an evaluation circuit for obtaining a switching signal from the change in the oscillation state. The alternating field can be generated by an analogue or digital circuit.

In the alternating field of the transmitting coil, two sensor coils are arranged in a direct differential circuit for sensing the difference in the voltages induced in the two sensor coils, wherein, due to their spatial position relative to one another and due to the respective numbers of turns, the sensor coils are formed such that, at the desired operating distance, the differential alternating voltage becomes zero. The three coils are ideally spaced apart from one another axially.

Here, in one embodiment, the differential alternating voltage is conducted to the input of the amplifier and is such that, when the differential alternating voltage (UD) passes through zero, the oscillator changes its oscillation state, in particular changes suddenly. Here, the oscillator is operating in a defined frequency range. In this embodiment, a generator can additionally be provided, which induces the resonant frequency of the oscillator, in this variant an amplifier can be dispensed with, with the result that the differential alternating voltage is conducted to the input of the generator.

In an alternative embodiment, the amplifier is likewise replaced by a generator, wherein any desired frequency of the transmitting coil can be induced since a capacitor arranged in series with the transmitting coil is not provided. The voltage amplitude applied to the sensor coils is analogously evaluated using a voltmeter.

Here, as a whole however, the transmitting coil and the two sensor coils are formed as circuit board coils, in particular as printed circuit board coils, the respective turns of which lie in a common plane for the respective circuit board, wherein each of the coils has a primary winding with a primary winding direction and the primary winding directions of the primary windings of the two sensor coils run in opposite directions to one another, and wherein at least one of the coils has a compensation winding with at least one turn, running in the opposite direction to its own primary winding, which is arranged radially outside the primary winding and on the same plane. The above-named planes of the coils spaced apart from one another axially are not to be understood as a plane in the mathematical sense, but rather describe a narrow layer or layers that are parallel, or substantially parallel, to one another.

In an improved embodiment of the inductive proximity switch, at least the transmitting coil or the two sensor coils are formed as a group of parallel coils. They are arranged on parallel planes, wherein each individual plane is formed by a carrier or circuit board. Advantageously, the number of planes of the transmitting coils is at least the number of planes of the sensor coils, ideally it is at least 1.5 times this number.

In a usual embodiment, from four to six planes, which each have a compensation winding or turn in the same plane or the same layer, are provided for the group of individual transmitting coils. The groups of individual sensor coils occupy up to four planes, wherein each individual sensor coil has from one to two compensation windings or turns. In an advantageous design, a total of 8 to 10 planes are thus to be provided with individual, printed coils.

In the following, "coils" are discussed further, wherein herebelow a group of at least two individual coils on two planes is always also to be understood.

In the embodiment example where each coil has at least one compensation winding, the effects and advantages are as follows:

The coaxially wound compensation winding, running in the opposite direction to the front sensor coil ensures a reduction in the switching distance when the sensor is installed in a surrounding metal, because that is not detected as a sensing object. Without a compensation winding, the sensor would detect the surrounding metal and provide a false-positive signal.

The compensation winding, wound in the opposite direction, of the transmitting coil in the central position substantially senses a surrounded threaded tube and reduces a disadvantageous change in switching distance when the coil system is introduced into the threaded tube in the production process. Furthermore, in this way any deformations or displacements of the threaded tube can also be partially compensated for.

If the rear sensor coil is expanded by at least one compensation winding, the oscillator properties are hereby substantially improved, with the result that undesired phase shifts between transmitted and received voltages can be corrected. In this way, very large switching distances can be achieved.

In an improved embodiment it is provided that at least one level of at least one group of coils is formed by applying, to a lower level or individual coil, at least one non-conductive separation layer in the form, for example, of a non-conductive varnish, resin or the like, to which the upper level or upper coil lying above is applied, wherein the coil was applied in particular using a printing or etching process. Advantageously, a protective coating, varnish, resin or the like is applied to the uppermost coil of a group layered in this way. In an advantageous embodiment, the coating has also been printed on using a process.

Advantageously, in the case of the transmitting coil and the two sensor coils, in each case only one compensation winding with at least one turn running in the opposite direction to its own primary winding is provided, which is arranged radially outside the respective primary winding. In addition, the turns of the primary windings of the transmitting coil and the two sensor coils are advantageously oriented parallel to one another, as is also the case for the respective compensation coil.

In an advantageous embodiment, in particular in the case of the use as a flush inductive proximity switch, the transmitting coil is arranged between the two sensor coils, in particular arranged with an identical distance between the sensor coils.

In an embodiment which is advantageous in particular for non-flush inductive proximity switches, the transmitting coil is arranged behind the sensor coils, wherein "behind" means from the viewing direction of the sensing side.

In a further improved embodiment, a specific ratio is maintained between the winding distances of primary winding and compensation winding. Here, the turns of the primary windings of the individual coils, thus on one plane, have a first winding distance from one another. The distance between the outermost turn of the primary winding and the innermost or the one turn of the compensation winding is much greater than the winding distance of the primary winding. This distance between primary winding and compensation winding is in particular at least twice and at most twenty times the winding distance of the primary winding.

Furthermore, the (inner) winding distance between the individual turns of the compensation winding is at most five times the winding distance of the primary winding.

Here, the three coils or groups of coils are spaced apart from one another axially, wherein the distance between the sensor coil and the transmitting coil is 20 to 100 times smaller than the coil diameter. Within a group of individual coils, the distance is smaller than 3 mm, ideally smaller than 1 mm.

In an advantageous embodiment, the two sensor coils are at the same, or substantially the same, distance from the centrally arranged transmitting coil. This has the advantage that the two sensor coils are substantially identical and, in this way, the best compromise between compactness and range of the sensor is achieved. In a special embodiment with a different distance between the two sensor coils and the centrally arranged transmitting coil, the winding ratios of the first sensor coils to the second sensor coil must be adapted accordingly.

In a further advantageous embodiment, it is provided that at least one compensation winding has precisely one turn on a plane, and wherein the one turn or winding encircles by at least 300 angular degrees, ideally encircles by at least 340 angular degrees. Advantageously, all compensation windings have precisely one turn on the respective plane.

The formation of a self-exciting system is particularly advantageous in energy terms. For this, a particularly advantageous embodiment provides that only an oscillator without an (active) generator is provided. Here, an LC resonator is formed across the transmitting coil acting as inductor and a parallel capacitor. This is connected in series with the amplifier and the sensor coils or the associated compensation coils to form an LC oscillator, wherein an alternating field can be generated. This alternating field is in particular a self-exciting alternating field oscillating at resonant frequency.

The disclosed embodiments furthermore also include a method for sensing a metallic object using an inductive proximity switch, which is formed according to one of the previous embodiments or a combination thereof.

Further details and advantages of the invention are now to be explained in more detail with reference to an embodiment example represented in the drawings.

FIG. 1 shows a schematic structure of the proximity switch 1, which has a schematically indicated housing 3 and three carrier substrates 4, 5 in the housing 3. These are arranged parallel to one another on the three planes E1, E2 and E3. A sensor coil 7, 8 is in each case arranged on each of the upper carrier substrate 4 and the lower carrier substrate 4, wherein the upper sensor coil 7 is arranged on the sensing side, which is indicated by the object 50 to be sensed. The inductive proximity sensor 1 is coupled with circuitry 20, which can be housed separately or can be an integral component of the proximity sensor. The circuitry 20 in particular comprises a capacitor 17, an amplifier 10 and a voltage measuring unit 6 for sensing the change in voltage of the sensor coils 7, 8, as stated below.

Figure 2A:
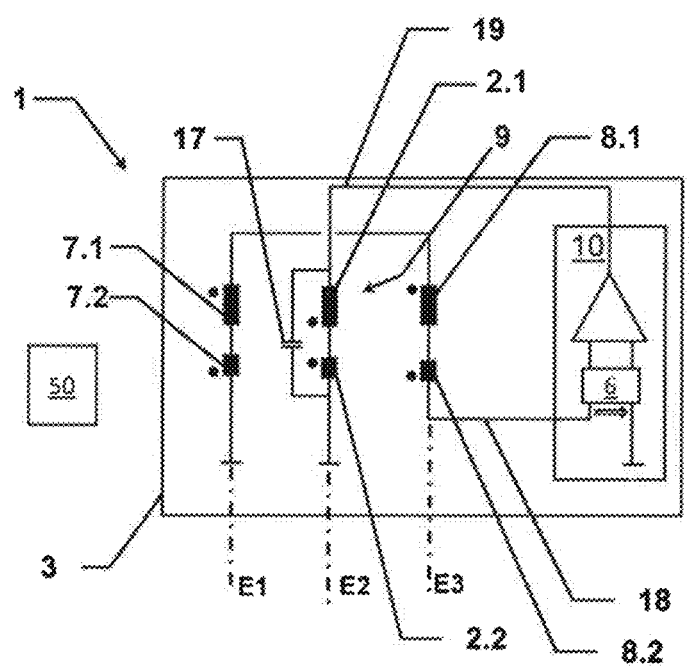
FIG. 2a is a circuit diagram depicting an embodiment of a proximity sensor.

In the example of FIG. 1 shown and that of FIG. 2a), the transmitting coil 2 acting as inductor and the parallel capacitor 17 are formed as an LC resonator. This is connected in series with the amplifier 10 and one or more sensor coils 2 or one or more associated compensation coils 2.2 to form an LC oscillator, whereby a self-exciting alternating field oscillating at resonant frequency is generated.

The two sensor coils 7, 8 are identical, but wound in opposite directions and have a compensation winding 7.2, 8.2 consisting of a single turn on the outer edge. Here, the respective flow direction of the current is indicated with the "X" and the "O". This compensation winding 7.2, 8.2 encircles the respective primary winding 7.1, 8.1 of the sensor coils 7, 8.

In an analogous manner, the primary winding 2.1 of the transmitting coil 2 also has a compensation winding 2.2 winding around it, which is at a distance A2 from the outermost turn of the associated primary winding 2.1. In the present case this is 4 times the winding distance W2 of the primary winding 2.1, as can be seen in detail in particular in FIG. 3.

The advantageous effects are hereby achieved that the switching distance is improved when the sensor is installed in a surrounding metal, compensation for any deformations or displacements of the threaded tube and finally the oscillator properties are improved by the rear compensation winding 8.2 of the rear sensor coil 8, with the result that undesired phase shifts between transmitted and received voltages can be corrected.

As can be seen in FIG. 2a) and as stated above, the proximity switch 1 is activated by an oscillator 9, which is connected, across a transmitting coil 2.1, 2.2 which, as inductor, forms an LC resonator together with a capacitor 17 and via the lead 19, in series with an amplifier 10 and the sensor coils 7.1, 7.2, 8.1, 8.2, to form an LC oscillator and generates an alternating field. The two sensor coils 7, 8 wound in opposite directions are arranged in a direct differential circuit. The resulting differential alternating voltage of the two sensor coils 7, 8 is supplied to the input of the amplifier 10 via the lead 18 and sensed by the voltmeter 6. Due to their spatial position on the two planes E1, E3 that are parallel to one another and the respective numbers of turns, the sensor coils 7, 8 are formed such that, when a trigger approaches, at the desired operating distance, the differential alternating voltage UD becomes zero, wherein the changes in the oscillation states are sensed in a manner that is not represented and are converted to a switching signal. Such circuits are known in principle to a person skilled in the art, for example from DE 44 29 314 B4 or DE 40 31 252 C1. The design of such circuits for different types of operation, for the material-dependent sensing (metallic, non-metallic) of different objects 50 is also known to a person skilled in the art, for example from the above-named DE 44 29 314 B4.

In a further embodiment (FIG. 2b), the amplifier 10 is replaced by a generator 21 and the voltage amplitude applied to the sensor coils 7, 8 is evaluated by means of the voltmeter 6.

For this, a generator 21, which is connected via the lead 19 and induces the resonant frequency of the resonator consisting of at least one transmitting coil 2 and associated compensation coils 2.2 as well as the capacitor 17, is provided. As stated above, the amplifier 10 can be dispensed with in this embodiment.

Figure 2B:
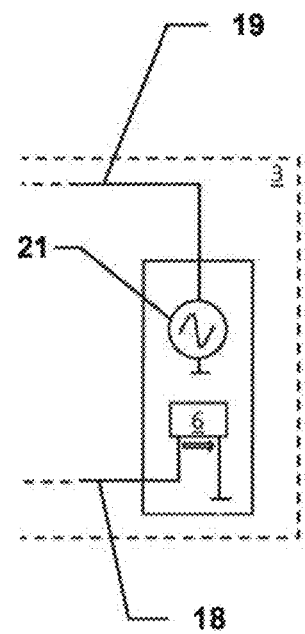
FIG. 2b is a circuit diagram depicting an alternative supply circuit for a proximity sensor as described herein.

The compensation windings 2.2, 7.2, 8.2 on all three planes are furthermore indicated in FIGS. 2a, 2b, in particular also that the oscillating capacitor 17 includes the supply and discharge leads beyond the compensation winding 2.2.

The individual coil substrates or boards 2, 7, 8 are represented in detail in FIG. 3. The outer sensor coils 7, 8 are constructed identically, but current flows through them in opposite directions. The primary winding 7.1, 8.1 of the sensor coils 7, 8 has a winding distance W1, not drawn in. The distance A1 from compensation winding 7.2, 8.2 is, for example, 10 times the winding distance W1.

The transmitting coil 2 located in the central position has a slightly larger winding distance W2 of the primary coil 2.1 compared with W1, whereby the best compromise between compactness and range of the flush sensor is achieved.

The distance A2 between the central primary winding 2.1 and the compensation winding 2.1 is, for example, five times the winding distance W2 of the primary winding 2.1.

The soldering and connection points 15, 16 and the outer fastenings 13, 14 can furthermore be seen. Here it can be seen that, for the compact design and the maximum radially outer guidance of the compensation windings 7.2, 8.2, the compensation winding 7.2, 8.2 winds around the soldering and contact points 15, 16 located in the outer layer and also the fastenings located on the edge over an angular range and, for this, the compensation winding has the course of a partial curve towards the inside.

Figure 4:
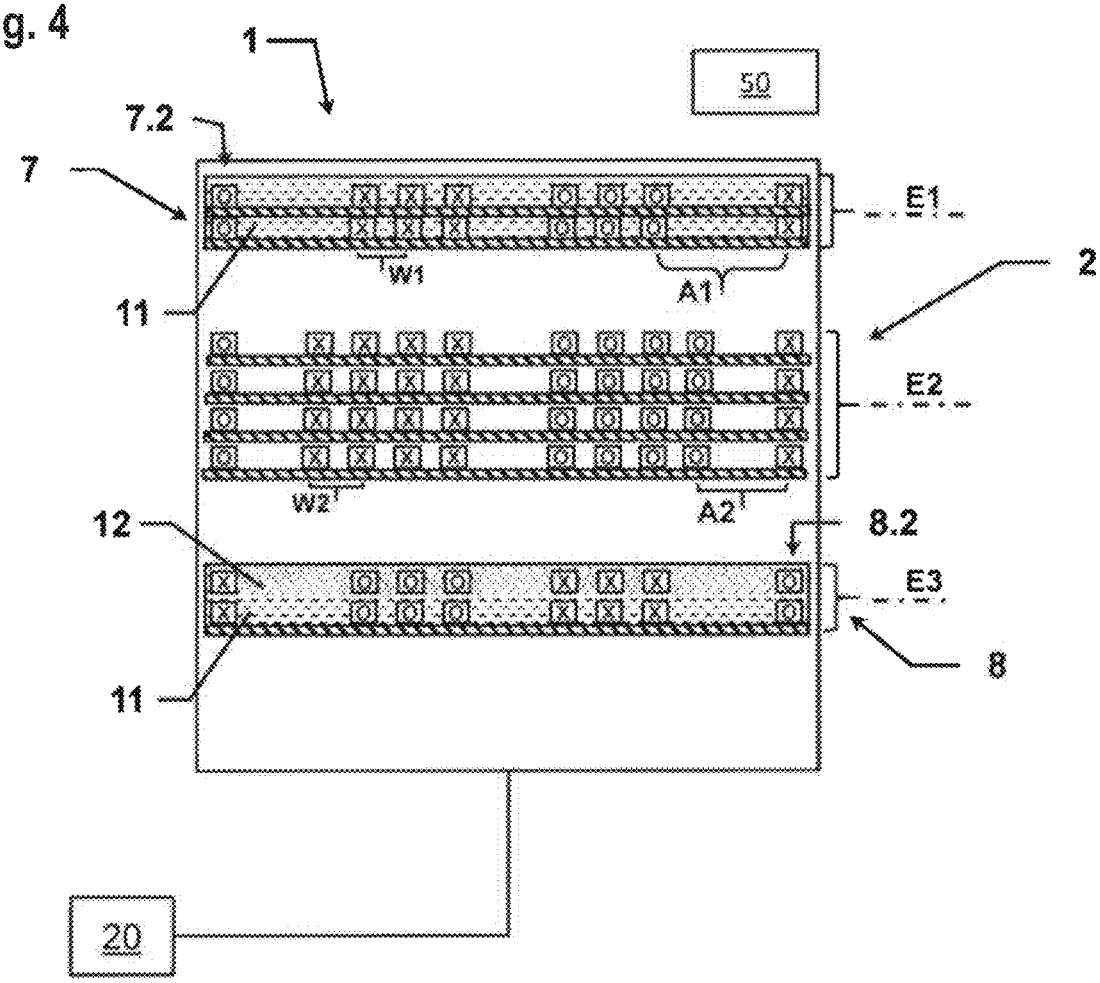
FIG. 4 is a cross-sectional view of an alternative embodiment of a proximity switch.

FIG. 4 shows the proximity switch according to FIG. 3 in a sectional representation. The groups each consisting of two sensor coils 7, 8 are covered with a coating 11, 12, as indicated with the dashed area. The distinctive feature of the rear group of sensor coils 8 is that an upper (individual) sensor coil, which is covered with a further coating 12, has been printed directly on the coating 11 of the lower, supporting individual coil, with the result that the two coatings 11, 12 merge into one another. The upper, individual sensor coil 8 thus has no coil carrier or circuit board of its own. The necessary contact with the lower coil is realized via a gap, not represented, in the lower coating 11.

As a rule, the two sensor coils 7, 8 are formed identically, thus according to the upper or lower variant. The group of transmitting coils 2 arranged in between is centered around the plane 2 and has the above-named winding distances W1 and the distance A2 from primary coil 2.1.

It can immediately be seen that a person skilled in the art will provide the features for the vertical coil structure of the embodiment example according to FIG. 4 in the other embodiment variants, if necessary.

Figure 5:
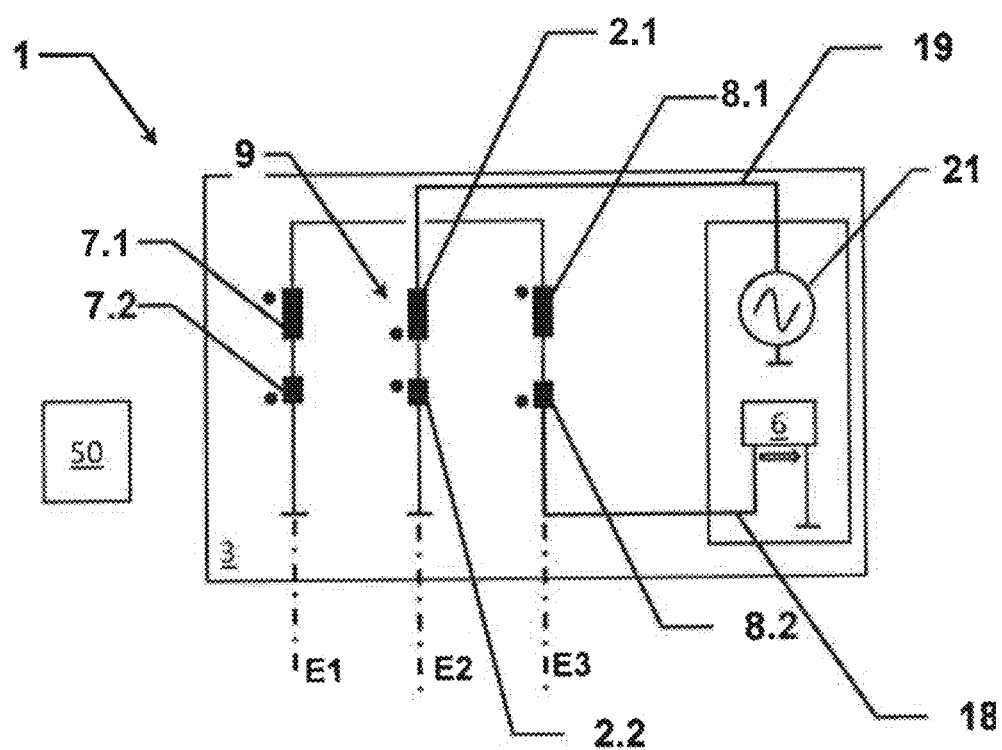
FIG. 5 is a circuit diagram depicting an embodiment of a proximity switch.

In a further embodiment (FIG. 5), a generator 21, which is connected via the lead 19 and can induce any desired frequency of the at least one transmitting coil 2 and associated compensation coils 2.2, is provided, since the capacitor 17 connected in series, as represented in FIG. 2b for example, is not provided.

The following set ("Set A") of numbered clauses set out various non-limiting embodiments disclosed herein:

A1. Inductive proximity switch (1) with a generator (21) and/or oscillator (9), which energizes a transmitting coil (2) generating an alternating magnetic field, and the oscillation state of which can be influenced by a metallic trigger (50) penetrating into the alternating field, and with an evaluation circuit for obtaining a switching signal from the change in the oscillation state, wherein, in the alternating field of the transmitting coil (2), two sensor coils (7, 8) are arranged in a direct differential circuit for sensing the difference in the voltages induced in the two sensor coils (7, 8), wherein, due to their spatial position relative to one another and due to the respective numbers of turns, the sensor coils (7, 8) are formed such that, at the desired operating distance, the differential alternating voltage becomes zero, and wherein the differential alternating voltage is conducted to the input of an amplifier (10) or of a generator (21), and wherein the three coils are spaced apart from one another axially, characterized in that the transmitting coil (2) and the two sensor coils (7, 8) are formed as circuit board coils, in particular as printed circuit board coils, the respective turns of which lie in a common plane (E1, E2, E3) for the respective circuit board, wherein each of the coils has a primary winding (2.1, 7.1, 8.1) with a primary winding direction and the primary winding directions of the primary windings (7.1, 8.1) of the two sensor coils (7, 8) run in opposite directions to one another, and wherein at least one of the coils has a compensation winding (2.2, 7.2, 8.2) with at least one turn, running in the opposite direction to its own primary winding (2.1, 7.1, 8.1), which is arranged radially outside the primary winding (2.1, 7.1, 8.1).

A2. Inductive proximity switch (1) according to clause A1, characterized in that at least transmitting coil (2), one or both sensor coils (7, 8) are formed as a group of parallel coils which are arranged on parallel planes, wherein in particular the number of planes of the transmitting coils (2) is at least the number of sensor coils (7, 8), ideally 1.5 times the number.

A3. Inductive proximity switch (1) according to clause A1 or A2, characterized in that the transmitting coil (2) and the two sensor coils (7, 8) each have a compensation winding (2.2, 7.2, 8.2) with at least one turn, running in the opposite direction to its own primary winding, which are arranged radially outside the respective primary winding (2.1, 7.1, 8.1).

A4. Inductive proximity switch (1) according to clause A1 or A2, characterized in that the turns of the primary windings (2.1, 7.1, 8.1) of the transmitting coil (2) and of the two sensor coils (7, 8) are oriented parallel to one another.

A5. Inductive proximity switch (1) according to one of the preceding clauses, characterized in that either the transmitting coil (2) is arranged between the two sensor coils (7, 8) or behind the two sensor coils (7, 8).

A6. Inductive proximity switch (1) according to one of the preceding clauses, characterized in that the turns of the primary windings (2.1, 7.1, 8.1) have a first winding distance (W1; W2) from one another and the distance (A1, A2) between the outermost turn of the primary winding (2.1, 7.1, 8.1) and the innermost turn of the compensation winding (2.2, 7.2, 8.2) is greater than the winding distance (W1), in particular at least twice and at most twenty times the winding distance (W1, W2).

A7. Inductive proximity switch (1) according to one of the preceding clauses, characterized in that the two sensor coils (7, 8) are at the same, or substantially the same, distance from the centrally arranged transmitting coil (2).

A8. Inductive proximity switch (1) according to one of the preceding clauses, characterized in that at least one compensation winding has precisely one turn, and wherein the turn encircles the central primary winding by at least 300 angular degrees, ideally encircles it by at least 340 angular degrees.

A9. Inductive proximity switch (1) according to clause A8, characterized in that the current flow in both lines (31, 32) is measured in a technically independent manner, and the measured values and/or data derived therefrom are evaluated together in a processor unit (6).

A10. Inductive proximity switch (1) according to one of the preceding clauses, characterized in that only an oscillator (9) without a generator is provided, wherein an LC resonator is formed, across the transmitting coil (2, 2.2) acting as inductor and a capacitor (17), which is connected in series with the amplifier (10) and the sensor coils (7, 7.2, 8, 8.2) to form an LC oscillator and by means of which an alternating field can be generated, in particular as a self-exciting alternating field oscillating at resonant frequency.

A11. Method for sensing a metallic object, characterized in that an inductive proximity switch (1) according to one of the preceding clauses A1 to A10 is used.

LIST OF REFERENCE NUMERALS

1 proximity switch
2 transmission coil
2.1 primary winding
2.2 compensation winding
3 housing
4 coil carrier
5 coil carrier
6 voltmeter
7 sensor coil, first
7.1 primary winding
7.2 compensation winding
8 sensor coil, second
8.1 primary winding
8.2 compensation winding
9 oscillator
10 amplifier
11 coating, first
12 coating, second
13 fastening, first
14 fastening, second
15 soldering and connection point, outer
16 soldering and connection point, inner
17 Capacitor
18 lead
19 lead
20 circuitry
21 generator
50 object
A1 distance
A2 distance
W1 winding distance
W2 winding distance The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized.

Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

What is claimed is:

1. An apparatus, comprising:
a transmission coil having turns formed on a first circuit board, wherein the transmission coil includes a first primary winding having a first winding direction;
a first sensor coil having turns formed on a second circuit board, wherein the first sensor coil includes a second primary winding having a second winding direction;
a second sensor coil having turns formed on a third circuit board, wherein the second sensor coil includes a third primary winding having a third winding direction opposite to the second winding direction; and wherein
the transmission coil, first sensor coil and second sensor coil are spaced apart from one another in a common axial direction,
at least one of the transmission coil, first sensor coil and second sensor coil includes a compensation winding having at least one turn,
the compensation winding is arranged radially outside of, and has a winding direction opposite to, the same coil's primary winding;
at least the transmission coil and one or both of the sensor coils is formed as a group of parallel coils arranged in parallel layers; and
a number of layers in the transmission coil is at least as high as a number of layers in either the first or second sensor coil.

2. The apparatus of claim 1, wherein:
each of the transmission coil, first sensor coil and second sensor coil includes a compensation winding having at least one turn; and
the compensation winding is arranged radially outside of, and has a winding direction opposite to, the same coil's respective primary winding.

3. The apparatus of claim 1, wherein turns of the first primary winding, second primary winding and third primary winding are oriented parallel to one another.

4. The apparatus of claim 1, wherein the transmission coil is arranged between the first and second sensor coils.

5. The apparatus of claim 1, wherein a distance between an innermost turn of the compensation winding and an outermost turn of the primary winding for the same coil is greater than a distance between turns of the primary winding.

6. The apparatus of claim 4, wherein a spacing between the transmission coil and the first sensor coil is the same as a spacing between the transmission coil and the second sensor coil.

7. The apparatus of claim 1, wherein the compensation winding has precisely one turn, and the turn encircles the primary winding for the same coil through at least 300 angular degrees.

8. The apparatus of claim 2, wherein each of the compensation windings has precisely one turn.

9. The apparatus of claim 1, further comprising a capacitor connected across the transmission coil.

10. The apparatus of claim 1, whereby the apparatus is an inductive proximity switch.

11. A method, comprising:
generating an alternating magnetic field using a transmission coil, wherein the transmission coil has turns formed on a first circuit board and includes a first primary winding having a first winding direction; and
sensing, using a first sensor coil and a second sensor coil, a change in the magnetic field caused by proximity of an object, wherein
the first sensor coil has turns formed on a second circuit board and includes a second primary winding having a second winding direction,
the second sensor coil has turns formed on a third circuit board and includes a third primary winding having a third winding direction opposite to the second winding direction,
the transmission coil, first sensor coil and second sensor coil are spaced apart from one another in a common axial direction, at least one of the transmission coil, first sensor coil and second sensor coil includes a compensation winding having at least one turn, the compensation winding is arranged radially outside of, and has a winding direction opposite to, the same coil's primary winding;

at least the transmission coil and one or both of the sensor coils is formed as a group of parallel coils arranged in parallel layers; and a number of layers in the transmission coil is at least as high as a number of layers in either the first or second sensor coil.

12. The method of claim 11, wherein a capacitor is connected across the transmission coil, and generating the alternating magnetic field includes connecting an amplifier between the transmission coil and a series combination of the first sensor coil and second sensor coil.

13. The method of claim 11, wherein generating the alternating magnetic field includes connecting a generator to the transmission coil.

14. The method of claim 11, wherein sensing the change in the magnetic field includes sensing a difference in voltages induced in first sensor coil and the second sensor coil.

15. The method of claim 11, wherein:

each of the transmission coil, first sensor coil and second sensor coil includes a compensation winding having at least one turn; and the compensation winding is arranged radially outside of, and has a winding direction opposite to, the coil's respective primary winding.

16. The method of claim 11, wherein a difference between an innermost turn of the compensation winding and an outermost turn of the primary winding for the same coil is greater than a distance between turns of the primary winding.

17. The method of claim 11, wherein the transmission coil is arranged between the first and second sensor coils.

18. The method of claim 11, wherein the first and second sensor coils are arranged between the transmission coil and the object.

19. The method of claim 11, wherein the compensation winding has precisely one turn and the turn encircles the primary winding for the same coil through at least 300 angular degrees.

20. The method of claim 11, wherein the method is for sensing a metallic object.

* * * * *